(12) United States Patent
Maoz et al.

(10) Patent No.: US 10,120,972 B1
(45) Date of Patent: Nov. 6, 2018

(54) SYSTEM AND METHOD FOR VISUALIZING INTERNAL INSTANCE STRUCTURE AND CONNECTIONS IN A DESIGN SYSTEM COMPONENT

(71) Applicant: Cadence Design Systems, Inc., San Jose, CA (US)

(72) Inventors: Uri Joel Maoz, Austin, TX (US); Ronen Shoham, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/381,490

(22) Filed: Dec. 16, 2016

(51) Int. Cl.
*G06F 11/22* (2006.01)
*G06F 17/50* (2006.01)

(52) U.S. Cl.
CPC ................................ *G06F 17/5081* (2013.01)

(58) Field of Classification Search
CPC ............. G06F 17/5077; G06F 2217/02; G06F 2217/74; G06F 3/048; G06F 17/5081
See application file for complete search history.

(56) References Cited

U.S. PATENT DOCUMENTS

| | | | | |
|---|---|---|---|---|
| 2010/0199234 | A1* | 8/2010 | Adya | G06F 17/5045 716/113 |
| 2011/0029944 | A1* | 2/2011 | Giffel | G06F 17/5077 716/126 |
| 2011/0219320 | A1* | 9/2011 | Majumder | G06F 17/30 715/763 |
| 2015/0154330 | A1* | 6/2015 | Yachide | G06F 17/5022 716/102 |
| 2016/0212021 | A1* | 7/2016 | Barry | H04L 43/04 |

* cited by examiner

*Primary Examiner* — Nha Nguyen
(74) *Attorney, Agent, or Firm* — Mark H. Whittenberger, Esq.; Holland & Knight LLP

(57) ABSTRACT

The present disclosure relates to a computer-implemented method for visualizing internal instance structure and connections in a design system component. Embodiments may include receiving, using at least one processor, an IP-XACT description of one or design elements and analyzing, using the at least one processor, the IP-XACT description of the one or design elements. Embodiments may further include displaying a graphical user interface, based upon, at least in part, the IP-XACT description of one or design elements, wherein the graphical user interface is configured to display a self-organizing graphical layout including a parent component, at least one node, and at least one edge.

20 Claims, 5 Drawing Sheets

SYSTEM AND METHOD FOR VISUALIZING INTERNAL INSTANCE STRUCTURE AND CONNECTIONS IN A DESIGN SYSTEM COMPONENT

FIELD OF THE INVENTION

The present disclosure relates to electronic design automation, and more specifically, to a system and method for visualizing aspects of a design system component.

DISCUSSION OF THE RELATED ART

Electronic design automation (EDA) utilizes software tools that may be used in the design and analysis of numerous electronic systems such as printed circuit boards (PCBs) and integrated circuits (ICs). A display may be used as an input at the start of the Design Process, which may specify all of the logical and physical parts on the design.

Design system components have a complex structure involving both hierarchy and connectivity. Internal components are instantiated inside each other forming a hierarchy. Interfaces and ports can connect components to their container and to sibling instances. The complete system can be extremely big and complex, and sizes and complexity both keep growing with every generation. This structure can be captured in metadata—an abstract text form. The industry standard for such metadata is IPXACT, which is an extensible markup language ("XML") format for description of design elements. The purpose of this format is to capture the full description in a machine readable form, not to make it legible. The description is both abstract and can be distributed across multiple files, and so requires computation in order to be elaborated into an accessible form.

Typically, the description of system component structure is typically done using a block diagram. This is an excellent description of the physical layout, but it has to be created manually by an expert familiar with the particular design. Producing such charts automatically is algorithmically difficult, and has no common or generally used solution. This restricts the availability and usefulness of such diagrams.

Specifically, the lack of an automatically created diagram restricts using this visual format in any interactive way, since a change in the structure may render an existing layout obsolete. This restricts its usability for editing, or otherwise for any visual exploration that would focus parts of, emphasize types of connections, or otherwise rearrange the layout.

The problem with block diagrams becomes exaggerated as the size and complexity of the system increases, to the point of becoming infeasible to produce manually above a certain size. Typically, only physical layout is described, as doing any reasoning and path analysis would complicate both the work and the result even for a smaller system. The size problem is a practical and problematic constraint, as large systems can already contain hundreds of blocks, and the more complex the system, the more a visual description can help in understanding it.

SUMMARY

In one or more embodiments of the present disclosure, a computer-implemented method for visualizing internal instance structure and connections in a design system component is provided. The method may include receiving, using at least one processor, an IP-XACT description of one or design elements and analyzing, using the at least one processor, the IP-XACT description of the one or design elements. The method may further include displaying a graphical user interface, based upon, at least in part, the IP-XACT description of one or design elements, wherein the graphical user interface is configured to display a self-organizing graphical layout including a parent component, at least one node, and at least one edge.

One or more of the following features may be included. In some embodiments, the self-organizing graphical layout includes a block diagram. The method may further include providing a user accessible search option at the graphical user interface. The user accessible search option may be configured to locate at least one of instances, interfaces, and ingress interfaces. The method may include allowing a selection of at least one instance or interface and calculating at least one route associated with the selection. Upon user selection, the method may include displaying the at least one route. The method may also include allowing a user to hide at least a portion of the self-organizing graphical layout.

In some embodiments, a computer-readable storage medium having stored thereon instructions that when executed by a machine result in one or more operations is provided. Operations may include receiving, using at least one processor, an IP-XACT description of one or design elements and analyzing, using the at least one processor, the IP-XACT description of the one or design elements. Operations may further include displaying a graphical user interface, based upon, at least in part, the IP-XACT description of one or design elements, wherein the graphical user interface is configured to display a self-organizing graphical layout including a parent component, at least one node, and at least one edge.

One or more of the following features may be included. In some embodiments, the self-organizing graphical layout includes a block diagram. Operations may further include providing a user accessible search option at the graphical user interface. The user accessible search option may be configured to locate at least one of instances, interfaces, and ingress interfaces. Operations may include allowing a selection of at least one instance or interface and calculating at least one route associated with the selection. Upon user selection, the method may include displaying the at least one route. Operations may also include allowing a user to hide at least a portion of the self-organizing graphical layout.

In one or more embodiments of the present disclosure, a system for visualizing internal instance structure and connections in a design system component is provided. The at least one processor may be configured to receive an IP-XACT description of one or design elements, the at least one processor further configured to analyzing the IP-XACT description of the one or design elements. The at least one processor may be further configured to display a graphical user interface, based upon, at least in part, the IP-XACT description of one or design elements, wherein the graphical user interface is configured to display a self-organizing graphical layout including a parent component, at least one node, and at least one edge.

One or more of the following features may be included. In some embodiments, providing a user accessible search option at the graphical user interface. The user accessible search option may be configured to locate at least one of instances, interfaces, and ingress interfaces. The at least one processor may be further configured to allow a selection of at least one instance or interface and calculating at least one route associated with the selection. Upon user selection, the method may include displaying the at least one route. The at least one processor may be further configured to allow a user to hide at least a portion of the self-organizing graphical layout.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
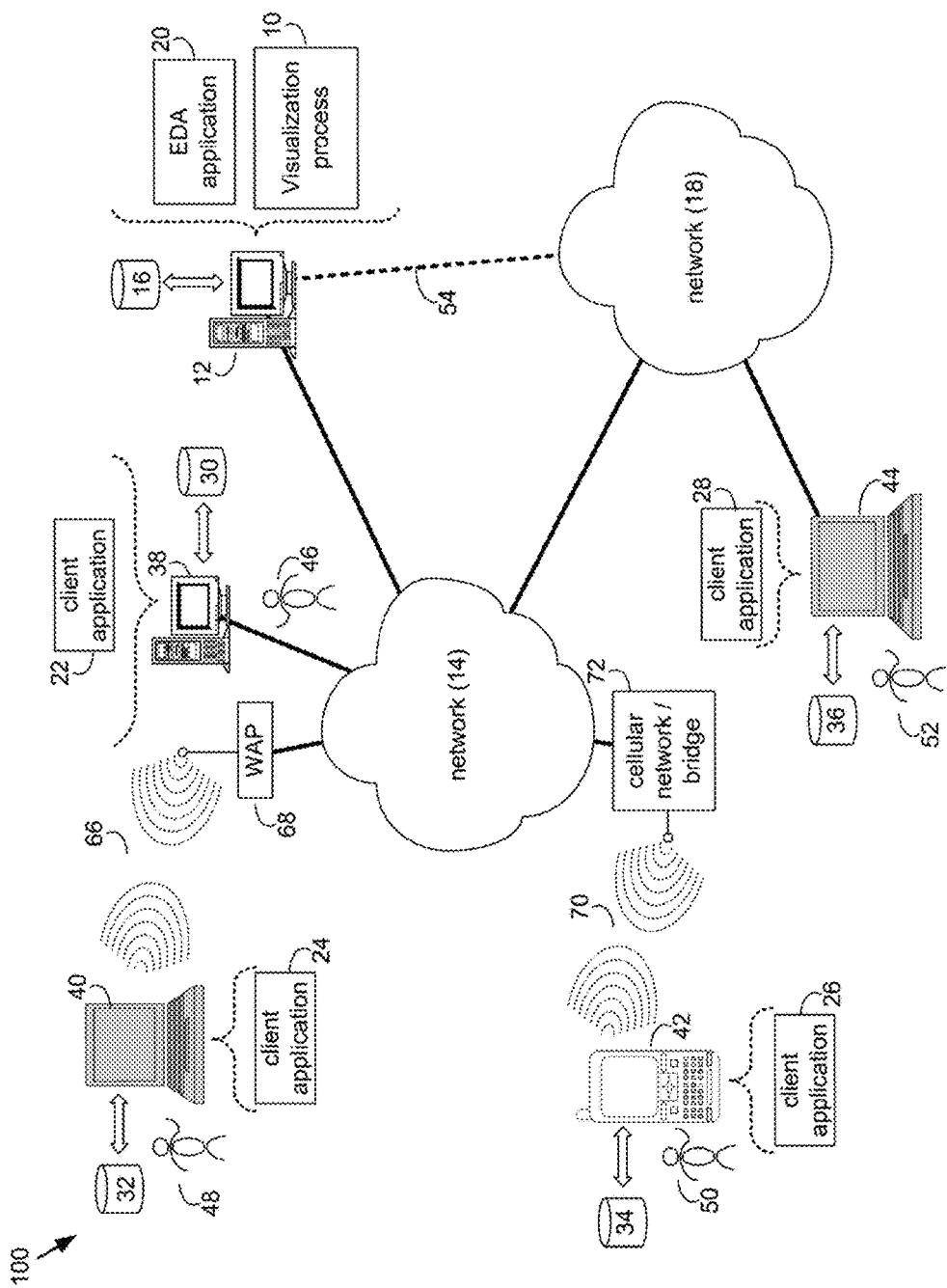
FIG. 1 is a system diagram depicting aspects of the visualization process in accordance with an embodiment of the present disclosure.

Embodiments of the present disclosure are directed towards a system and method for visualizing internal instance structure and connections in a design system component is provided. Embodiments provided herein may include a self-organizing graphical layout algorithm. In this layout every element may be given simulated physical properties of charge and repulsion, such that when the network is run through a simulation it stabilizes itself into a layout that had desirable visual properties. This balance is dynamic, and so editing and other manipulations of the data give immediate and useful feedback.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, a number of processes that may reside on and may be executed by server computer 12, which may be connected to network 14 (e.g., the Internet or a local area network) are provided. Embodiments of the present disclosure are directed towards a visualization process 10, which is discussed in further detail hereinbelow. Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the processes described herein may reside on and be executed, in whole or in part, by a client electronic device, such as a personal computer, notebook computer, personal digital assistant, or the like.

The instruction sets and subroutines of visualization process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language ("HDL") files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Visualization process 10 may be a stand alone application, or may be an applet/application/script that may interact with and/or be executed within EDA application 20. In addition/as an alternative to being a server-side process, visualization process 10 may be a client-side process (not shown) that may reside on a client electronic device (described below) and may interact with an EDA client application (e.g., one or more of EDA client applications 22, 24, 26, 28). Further, the visualization process 10 may be a hybrid server-side/client-side process that may interact with EDA application 20 and an EDA client application (e.g., one or more of client applications 22, 24, 26, 28). As such, visualization process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize visualization process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
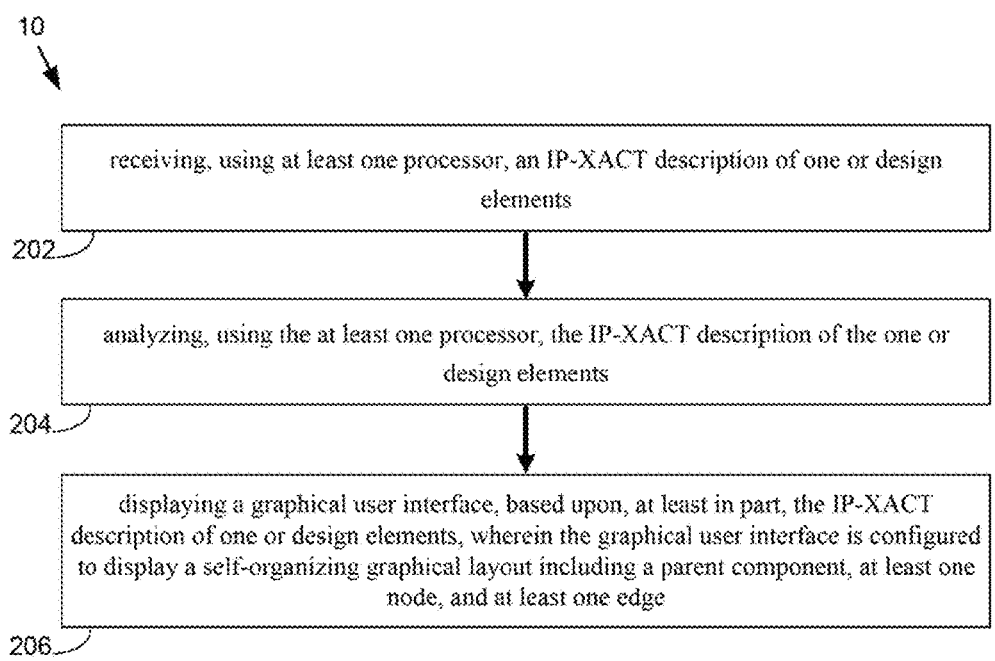
FIG. 2 is a flowchart depicting operations consistent with the visualization process of the present disclosure.

Referring now to FIG. 2, an embodiment of visualization process 10 for visualizing one or more IP-XACT component data routes is provided. The method may include receiving (202), using at least one processor, an IP-XACT description of one or design elements and analyzing (204), using the at least one processor, the IP-XACT description of the one or design elements. The method may further include displaying (206) a graphical user interface, based upon, at least in part, the IP-XACT description of one or design elements, wherein the graphical user interface is configured to display a self-organizing graphical layout including a parent component, at least one node, and at least one edge.

In some embodiments, EDA application 20 and/or visualization process 10 may support a variety of languages and/or standards. EDA application 20 may support one or more software extensions and may be used in conjunction with one or more EDA tools such as those available from the Assignee of the subject application.

As discussed above, design system components have an internal structure consisting of instantiations of other component types and their connections. These connections can be at the level of interfaces or of ports, and can be between instances or between instances and the containing component.

Embodiments of the visualization process 10 included herein provide a self-organizing diagram which is useful for visualizing, understanding, and exploring the structure of such a component. This diagram does not require any interaction or preparation and may be based on an industry standard description format called IPXACT, however interaction can be used to enable editing directly in this visual form.

Embodiments of the visualization process 10 include a self-organizing graphical layout algorithm. In this layout every element may be given simulated physical properties of charge and repulsion, such that when the network is run through a simulation it stabilizes itself into a layout that had desirable visual properties. This balance is dynamic, and so editing and other manipulations of the data give immediate and useful feedback.

Embodiments of the visualization process 10 include applying a graphical layout algorithm to the domain of visualizing system components in the design domain, in a way that enables both visualization and editing in a form and to a degree that wasn't available previously.

Figure 3:
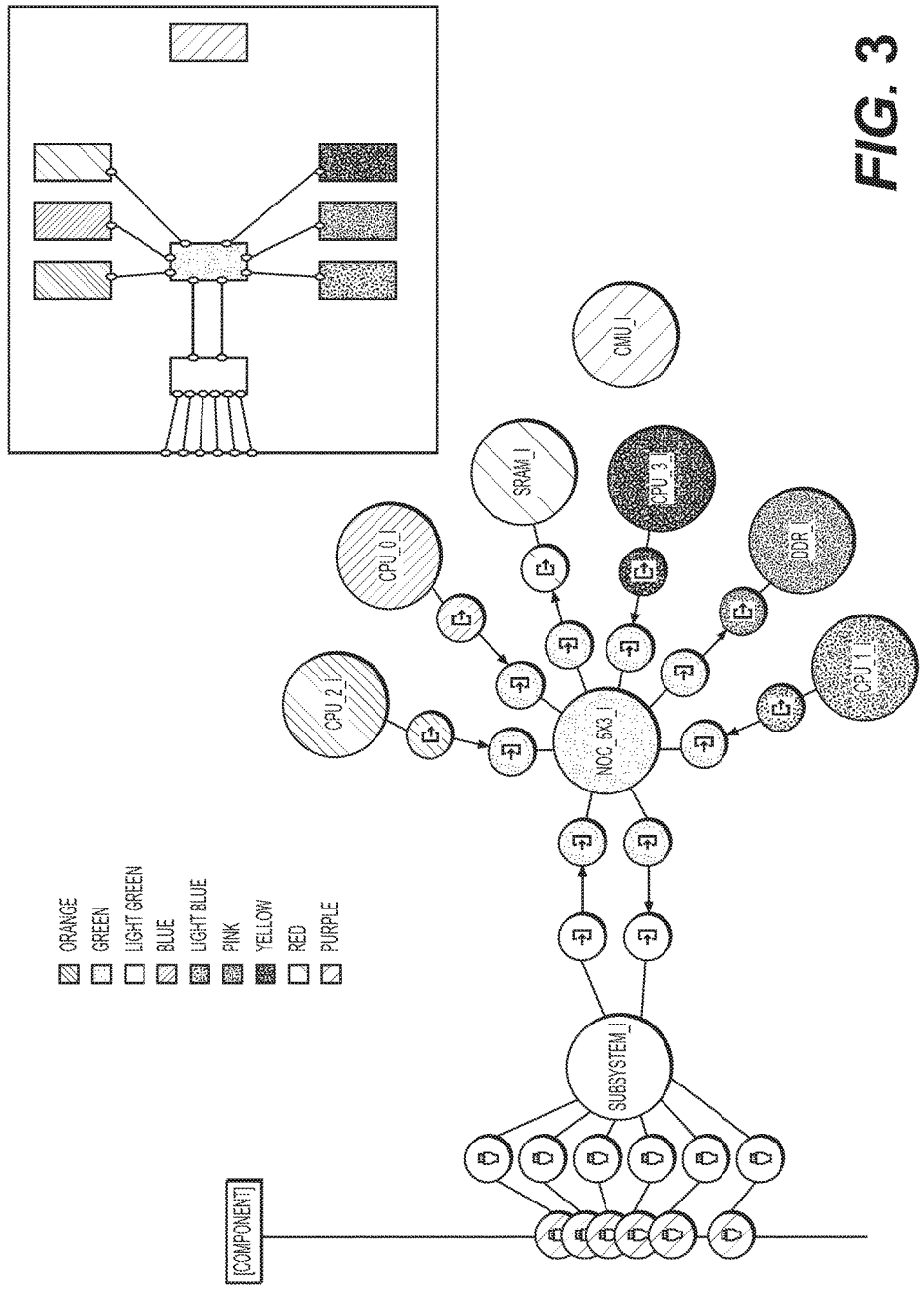
FIG. 3 is a diagram depicting aspects of the visualization process in accordance with an embodiment of the present disclosure.
Figure 4:
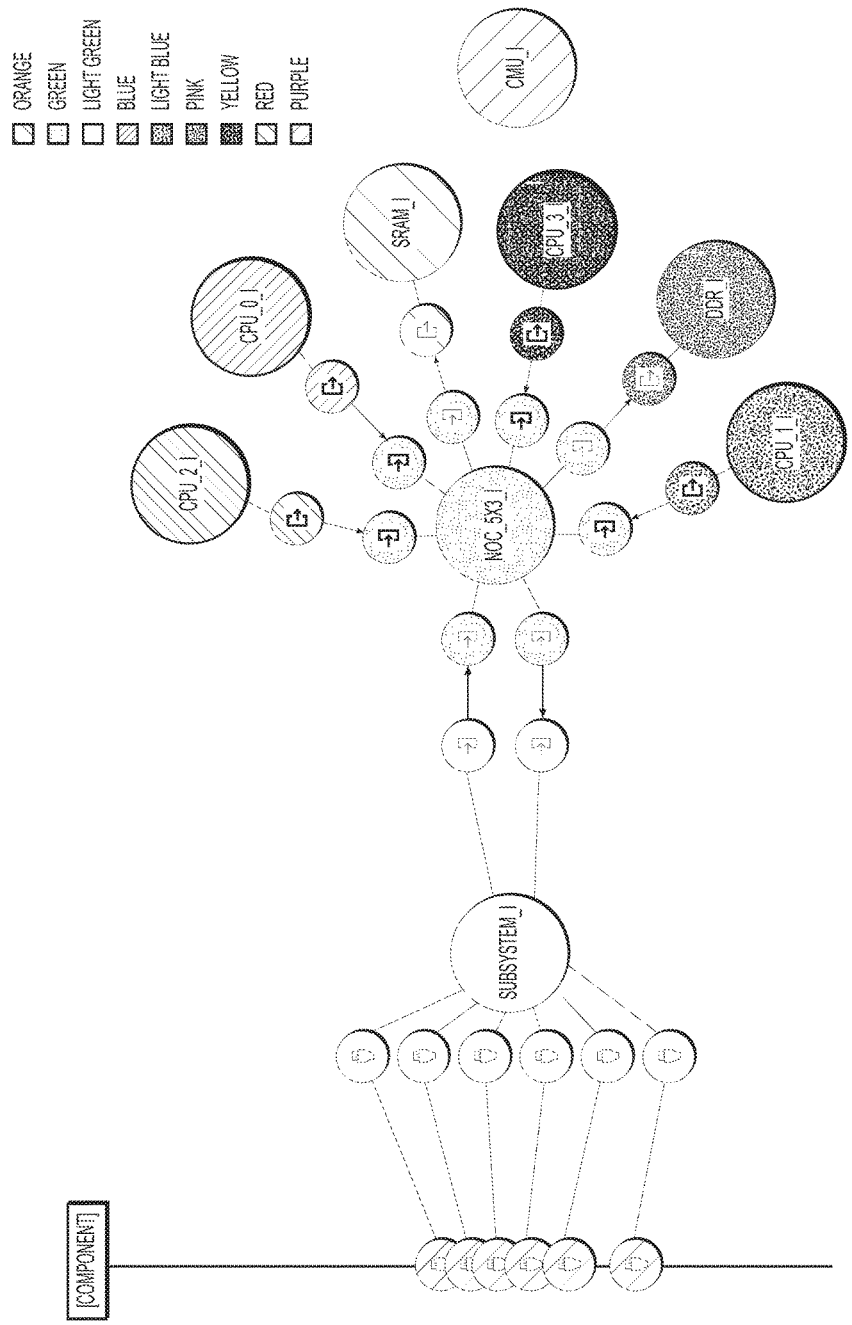
FIG. 4 is a diagram depicting aspects of the visualization process in accordance with an embodiment of the present disclosure.
Figure 5:
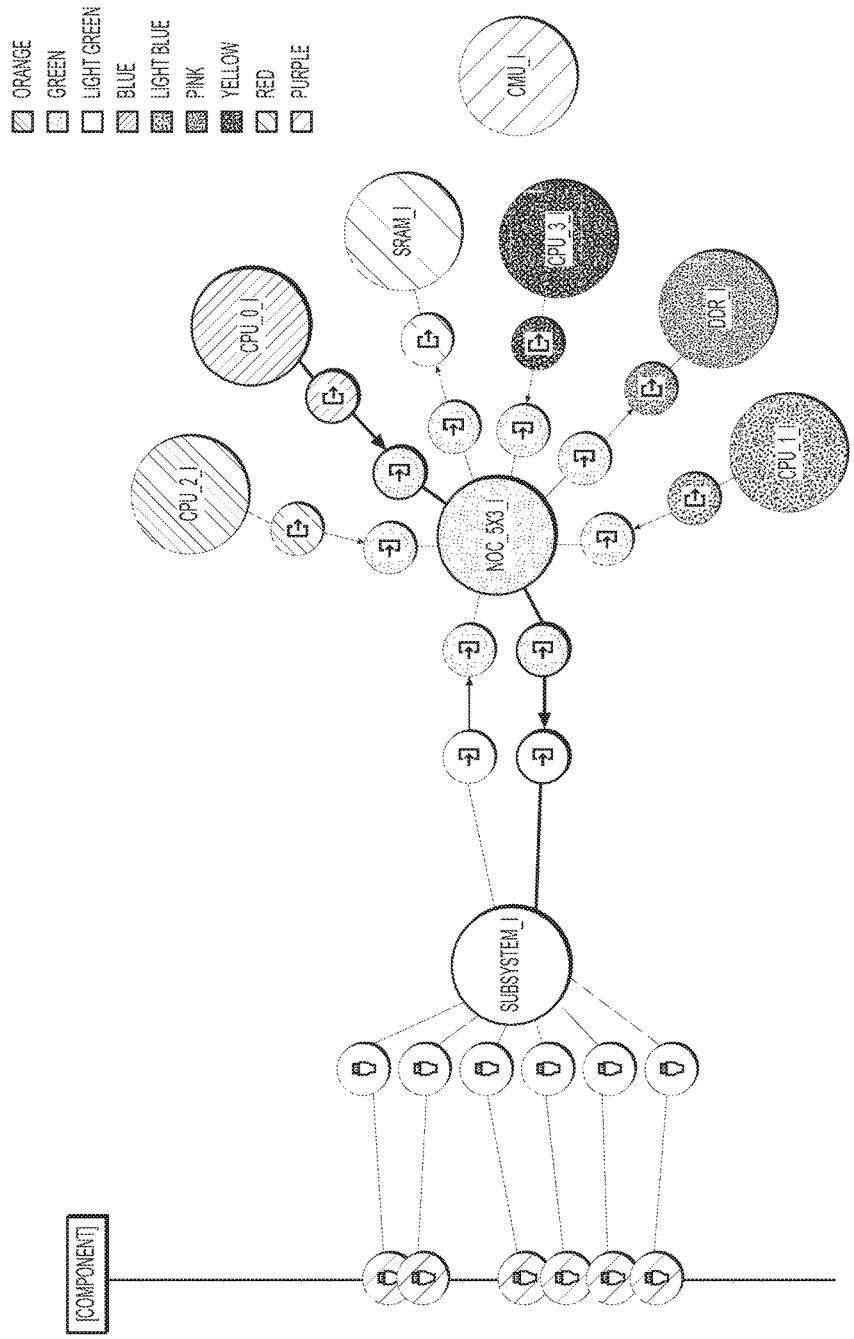
FIG. 5 is a diagram depicting aspects of the visualization process in accordance with an embodiment of the present disclosure.

Referring now to FIGS. 3-5, embodiments of visualization process 10 are provided. In the figures the parent component is the containing boundary and it may be represented by a vertical line. All nodes may be represented by circles and the circles may repulse each other. All internal components are big nodes and interfaces are small nodes. With respect to edges, a connection may be represented as a line between the connected entities. Should the connection be directional, the line may be displayed as an arrow pointing in the direction of the data flow. Colors may be randomly assigned from a limited palette to components. This makes it unlikely that connected nodes will have the same color. Interfaces may have the same color as their component.

In some embodiments, and with respect to interactivity, selecting a node makes all nodes and edges not directly connected to it or otherwise selected transparent. In some embodiments, nodes may be selected temporarily by hovering. Additionally and/or alternatively, nodes can be selected by dragging them, which also fixes their location to where the user places them, readjusting the rest of the diagram accordingly. Nodes may be released one by one, or all at once. Following the above points—all nodes and edges are only visible in the condition of no selection, which is the starting state.

In some embodiments, and with respect to edge filtering, interface connections and port connections normally have different intentions. Edge visibility may be changed between all, interface only, or port only. Hiding edges removes their effect from the simulation, triggering layout correction. The chart can be panned and zoomed at will.

An example of the original IPXACT description is provided below. This is the file being visualized, although the full diagram relies on multiple other files, completing the description of this component, and providing descriptions for all the internal components and their interfaces.

<?xml version="1.0" encoding="utf-8"?>
<spirit:design xmlns:spirit="http://www.spiritconsortium.org/XMLSchema/SPIRIT/1685-2009"xmlns:xsi=http://www.w3.org/2001/XMLSchema-instance xsi:schemaLocation="http://www.spiritconsortium.org/XMLSchema/SPIRIT/1685-2009 http://www.spiritconsortium.org/XMLSchema/SPIRIT/1685-2009/index.xsd">
<spirit:vendor>cadence.com</spirit:vendor>
<spirit:library>demo</spirit:library>
<spirit:name>slab_design</spirit:name>
<spirit:version>1.0</spirit:version>
<spirit:componentInstances>
<spirit:componentInstance>
<spirit:instanceName>cpu_0_i</spirit:instanceName>

```xml
<spirit:componentRef spirit:vendor="cadence.com" spirit:library="demo" spirit:name="cpu" spirit:version="1.0"/>
</spirit:componentInstance>
<spirit:componentInstance>
<spirit:instanceName>cpu_1_i</spirit:instanceName>
<spirit:componentRef spirit:vendor="cadence.com" spirit:library="demo" spirit:name="cpu" spirit:version="1.0"/>
</spirit:componentInstance>
<spirit:componentInstance>
<spirit:instanceName>cpu_2_i</spirit:instanceName>
<spirit:componentRef spirit:vendor="cadence.com" spirit:library="demo" spirit:name="cpu" spirit:version="1.0"/>
</spirit:componentInstance>
<spirit:componentInstance>
<spirit:instanceName>cpu_3_i</spirit:instanceName>
<spirit:componentRef spirit:vendor="cadence.com" spirit:library="demo" spirit:name="cpu" spirit:version="1.0"/>
</spirit:componentInstance>
<spirit:componentInstance>
<spirit:instanceName>noc_5x3_i</spirit:instanceName>
<spirit:componentRef spirit:vendor="cadence.com" spirit:library="demo" spirit:name="noc_5x3" spirit:version="1.0"/>
</spirit:componentInstance>
<spirit:componentInstance>
<spirit:instanceName>subsystem_i</spirit:instanceName>
<spirit:componentRef spirit:vendor="cadence.com" spirit:library="demo" spirit:name="subsystem" spirit:version="1.0"/>
</spirit:componentInstance>
<spirit:componentInstance>
<spirit:instanceName>sram_i</spirit:instanceName>
<spirit:componentRef spirit:vendor="cadence.com" spirit:library="demo" spirit:name="sram" spirit:version="1.0"/>
</spirit:componentInstance>
<spirit:componentInstance>
<spirit:instanceName>ddr_i</spirit:instanceName>
<spirit:componentRef spirit:vendor="cadence.com" spirit:library="demo" spirit:name="ddr" spirit:version="1.0"/>
</spirit:componentInstance>
<spirit:componentInstance>
<spirit:instanceName>crmu_i</spirit:instanceName>
<spirit:componentRef spirit:vendor="cadence.com" spirit:library="demo" spirit:name="soc_crmu" spirit:version="1.0"/>
</spirit:componentInstance>
</spirit:componentInstances>
<spirit:interconnections>
<spirit:interconnection>
<spirit:name>cpu_0_i_data_noc_5x3_i_m0</spirit:name>
<spirit:activeInterface spirit:componentRef="cpu_0_i" spirit:busRef="data"/>
<spirit:activeInterface spirit:componentRef="noc_5x3_i" spirit:busRef="m0"/>
</spirit:interconnection>
<spirit:interconnection>
<spirit:name>cpu_1_i_data_noc_5x3_i_m1</spirit:name>
<spirit:activeInterface spirit:componentRef="cpu_1_i" spirit:busRef="data"/>
<spirit:activeInterface spirit:componentRef="noc_5x3_i" spirit:busRef="m1"/>
</spirit:interconnection>
<spirit:interconnection>
<spirit:name>cpu_2_i_data_noc_5x3_i_m2</spirit:name>
<spirit:activeInterface spirit:componentRef="cpu_2_i" spirit:busRef="data"/>
<spirit:activeInterface spirit:componentRef="noc_5x3_i" spirit:busRef="m2"/>
</spirit:interconnection>
<spirit:interconnection>
<spirit:name>cpu_3_i_data_noc_5x3_m3</spirit:name>
<spirit:activeInterface spirit:componentRef="cpu_3_i" spirit:busRef="data"/>
<spirit:activeInterface spirit:componentRef="noc_5x3_i" spirit:busRef="m3"/>
</spirit:interconnection>
<spirit:interconnection>
<spirit:name>subsystem_i_s0_noc_5x3_m4</spirit:name>
<spirit:activeInterface spirit:componentRef="subsystem_i" spirit:busRef="s0"/>
<spirit:activeInterface spirit:componentRef="noc_5x3_i" spirit:busRef="m4"/>
</spirit:interconnection>
<spirit:interconnection>
<spirit:name>subsystem_i_m0_noc_5x3_s2</spirit:name>
<spirit:activeInterface spirit:componentRef="subsystem_i" spirit:busRef="m0"/>
<spirit:activeInterface spirit:componentRef="noc_5x3_i" spirit:busRef="s2"/>
</spirit:interconnection>
<spirit:interconnection>
<spirit:name>sram_i_data_noc_5x3_s0</spirit:name>
<spirit:activeInterface spirit:componentRef="sram_i" spirit:busRef="data"/>
<spirit:activeInterface spirit:componentRef="noc_5x3_i" spirit:busRef="s0"/>
</spirit:interconnection>
<spirit:interconnection>
<spirit:name>ddr_i_data_noc_5x3_i_s1</spirit:name>
<spirit:activeInterface spirit:componentRef="ddr_i" spirit:busRef="data"/>
<spirit:activeInterface spirit:componentRef="noc_5x3_i" spirit:busRef="s1"/>
</spirit:interconnection>
</spirit:interconnections>
<spirit:hierConnections>
<spirit:hierConnection spirit:interfaceRef="pcie0">
<spirit:interface spirit:componentRef="subsystem_i" spirit:busRef="pcie0"/>
</spirit:hierConnection>
<spirit:hierConnection spirit:interfaceRef="usb0">
<spirit:interface spirit:componentRef="subsystem_i" spirit:busRef="usb0"/>
</spirit:hierConnection>
<spirit:hierConnection spirit:interfaceRef="usb1">
<spirit:interface spirit:componentRef="subsystem_i" spirit:busRef="usb1"/>
</spirit:hierConnection>
<spirit:hierConnection spirit:interfaceRef="csi0">
<spirit:interface spirit:componentRef="subsystem_i" spirit:busRef="csi0"/>
</spirit:hierConnection>
<spirit:hierConnection spirit:interfaceRef="i2c0">
<spirit:interface spirit:componentRef="subsystem_i" spirit:busRef="i2c0"/>
</spirit:hierConnection>
<spirit:hierConnection spirit:interfaceRef="i2c1">
<spirit:interface spirit:componentRef="subsystem_i" spirit:busRef="i2c1"/>
</spirit:hierConnection>
</spirit:hierConnections>
</spirit:design>
```

In some embodiments, in order to aesthetically and functionally improve the layout created automatically by various modelled forces (e.g., attraction, repulsion, etc.), constraints can be added in order to restrict the location of various elements in relation to each other. In particular, by constraining alignments to the same horizontal or vertical line or area, rectangular or linear layouts can be created.

When such constraints are in effect, the shape of the participating elements—instances and interfaces—can be made rectangular, while still maintaining good visual separation. Such layouts may be made to resemble the more industry standard block layouts, while maintaining the automatic and interactive nature of this invention. For example, using constraints to allow rectangular shapes transforms the circular representation shown in FIG. 3 so it approximates a block diagram, which is displayed in the right portion of FIG. 3.

In some embodiments, a search option may be provided to allow the user to locate in the diagram any item that matches a search pattern. The search pattern can include a string of characters or a regular expression to match the item by name or type, and possibly a filter to indicate only items of a particular type are to be found—instances, interfaces, ingress interfaces only, etc. For example, and as shown in FIG. 4, searching for the string "cpu" in instance names provides display 400 of FIG. 4.

In some embodiments, when routing information is taken into account, the complete routing information of the described system may be explored. It may then be possible to select any interface or instance and calculate all the instances and interfaces in the diagram which participate or are endpoints for data routes from that starting point, and at what address ranges.

In some embodiments, visualization process 10 may enable the view of this information to see the routes from a selected instance or interface, either all or those mapped to a particular address range, and either by hiding all other elements or connection, or simply by making them near transparent. In some embodiments, visualization process 10 may allow for the transfer of this selection of point of view and address ranges, so as to serve as the starting point for a tool that can show/edit data routes. For example, and as shown in FIG. 5, querying a specific address range on the egress interface of "cpu_0_i" shows it reaches "subsystem_i".

In some embodiments, and beyond the already described options for hiding parts of the diagram by selecting items and making only them and the items connected to the visible, more advanced forms for exploration and organization by hiding/revealing parts of the diagram are provided. Some of these may include, but are not limited to, show/hide/obscure all, show/hide/obscure interactively (e.g., by selecting with the mouse, etc.), show/hide/obscure by search, show/hide/obscure by following routes. For example, this may be turned on or off globally, and also set to follow immediate connections (1$^{st}$ level), only physical connections, to take routing analysis into account, etc. It may also be selected interactively, in order to highlight/hide/obscure from the point of selection.

In some embodiments, since the complete description can be very large and contain many elements, it may be hard to understand, and may also suffer from reduced performance. In order to help both understandability and performance, the visibility of certain elements can be controlled. For example, with respect to interface visibility, it may be hidden entirely, the connections can be made to appear to be direct from instance to instance, and/or upon user request the interfaces can be made to appear either globally for all instances and or through selection (e.g., of an instance, connection, route, search, etc.).

In some embodiments, with respect to port connection consolidation, ports may be mapped to interfaces and connections may be between ports or interfaces. The same connection can be described as a single interface connection, or a connection between each of the participating ports. When connections exist between ports that are also mapped to an interface, this can also be presented as an interface connection—reducing the overall number of connections. This connection can be shown to the user as a special type (e.g. derived from port connections), and a metric can be added to show completeness (e.g. 75% of ports mapped).

In some embodiments, with respect to connection visibility, connections have various types, and the user may not be interested in all at once. For example, the user may want to view only port connections, clock port connections, reset port connections, and/or port connections that can be mapped to interface connections, or only the ones that cannot be mapped. Additionally and/or alternatively, the user may want to view only interface connections, addressable connections, and/or non-addressable connections.

In some embodiments, the process of resolving the full instance tree is called elaboration. Embodiments of visualization process 10 may provide a very useful and innovative way for presenting and exploring the elaborated view, by drawing into every instance element its own diagram, and connecting the interfaces going between the levels. The elaborated view is more complex by definition than the non-elaborated view, potentially much more so. The main step taken to control this is to have the user request this view explicitly on a per instance basis. Accordingly, in some embodiments, the user may be able to manipulate all the visible elements in a number of ways. Some of these may include but are not limited to, adding/removing instances (e.g., adding—by selecting any suitable component type and proving a name or removing—by selecting an instance and choosing to delete it), adding/removing interface connections (e.g., adding—by selecting two interfaces and choosing to add an interface by dragging between them or removing—by selecting an interface connection and choosing to delete it), adding/removing port connections (e.g., adding—by choosing two instances (possibly the containing interface), choosing to add a port connection, and choosing a port on both sides to connect (the two port lists will be displayed to select from) or removing—by selecting a port connection and choosing to delete it).

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer implemented method for interactively visualizing internal instance structure and connections in a design system component comprising:
 receiving, using at least one processor, an IP-XACT description of one or more design elements;
 analyzing, using the at least one processor, the IP-XACT description of the one or design elements;
 displaying a graphical user interface, based upon, at least in part, the IP-XACT description of one or design elements, wherein the graphical user interface is configured to display a self-organizing graphical layout including a parent component, at least one node, and at least one edge, the self-organizing graphical layout being based upon, at least in part, simulated physical properties of charge and repulsion; and
 allowing a user to select, at the graphical user interface, an element corresponding to one or more of the parent component, the at least one node, and the at least one edge and wherein upon user selection of the element any nodes or edges that are not directly connected to the element are graphically de-emphasized.

2. The computer implemented method of claim 1, wherein the self-organizing graphical layout includes a block diagram, and wherein the graphical user interface is configured to simultaneously display a first self-organizing graphical layout including a parent component, at least one node, and at least one edge and a second self-organizing graphical layout having the block diagram, wherein the second self-organizing graphical layout is associated with the first self-organizing graphical layout.

3. The computer implemented method of claim 1, further comprising:
 providing a user accessible search option at the graphical user interface.

4. The computer implemented method of claim 3, wherein the user accessible search option is configured to locate at least one of instances, interfaces, and ingress interfaces.

5. The computer implemented method of claim 1, further comprising:
 allowing a selection of at least one instance or interface; and
 calculating at least one route associated with the selection.

6. The computer implemented method of claim 5, further comprising:
 upon user selection, displaying the at least one route.

7. The computer implemented method of claim 1, further comprising:
 allowing a user to hide at least a portion of the self-organizing graphical layout.

8. A non-transitory computer readable medium having stored thereon instructions, which when executed by a processor result in one or more operations, the operations comprising:
 receiving, using at least one processor, an IP-XACT description of one or more design elements;
 analyzing, using the at least one processor, the IP-XACT description of the one or design elements;
 displaying a graphical user interface, based upon, at least in part, the IP-XACT description of one or design elements, wherein the graphical user interface is configured to display a self-organizing graphical layout including a parent component, at least one node, and at least one edge, the self-organizing graphical layout being based upon, at least in part, simulated physical properties of charge and repulsion; and
 allowing a user to select, at the graphical user interface, an element corresponding to one or more of the parent component, the at least one node, and the at least one edge and wherein upon user selection of the element any nodes or edges that are not directly connected to the element are graphically de-emphasized.

9. The computer readable medium of claim 8, wherein the self-organizing graphical layout includes a block diagram, and wherein the graphical user interface is configured to simultaneously display a first self-organizing graphical layout including a parent component, at least one node, and at least one edge and a second self-organizing graphical layout having the block diagram, wherein the second self-organizing graphical layout is associated with the first self-organizing graphical layout.

10. The computer readable medium of claim 8, further comprising:
 providing a user accessible search option at the graphical user interface.

11. The computer readable medium of claim 10, wherein the user accessible search option is configured to locate at least one of instances, interfaces, and ingress interfaces.

12. The computer readable medium of claim 8, further comprising:
 allowing a selection of at least one instance or interface; and
 calculating at least one route associated with the selection.

13. The computer readable medium of claim 12, further comprising:
 upon user selection, displaying the at least one route.

14. The computer readable medium of claim 8, further comprising:
 allowing a user to hide at least a portion of the self-organizing graphical layout.

15. A system for interactively visualizing internal instance structure and connections in a design system component comprising:
 at least one processor configured to receive an IP-XACT description of one or more design elements, the at least one processor further configured to analyzing the IP-XACT description of the one or design elements, the at least one processor further configured to display a graphical user interface, based upon, at least in part, the IP-XACT description of one or design elements, wherein the graphical user interface is configured to display a graphical user interface, based upon, at least in part, the IP-XACT description of one or design elements, wherein the graphical user interface is configured to display a self-organizing graphical layout including a parent component, at least one node, and at least one edge, the self-organizing graphical layout being based upon, at least in part, simulated physical properties of charge and repulsion, wherein the graphical user interface is further configured to allow a user to select, at the graphical user interface, an element corresponding to one or more of the parent component, the at least one node, and the at least one edge and wherein upon user selection of the element any nodes or edges that are not directly connected to the element are graphically de-emphasized.

16. The system of claim 15, wherein the self-organizing graphical layout includes a block diagram, and wherein the graphical user interface is configured to simultaneously display a first self-organizing graphical layout including a parent component, at least one node, and at least one edge and a second self-organizing graphical layout having the block diagram, wherein the second self-organizing graphical layout is associated with the first self-organizing graphical layout.

17. The system of claim 15, the at least one processor is configured to provide a user accessible search option at the graphical user interface.

18. The system of claim 17, wherein the user accessible search option is configured to locate at least one of instances, interfaces, and ingress interfaces.

19. The system of claim 15, the at least one processor is configured to allow a selection of at least one instance or interface; and calculating at least one route associated with the selection.

20. The system of claim 19, the at least one processor is configured to, upon user selection, display the at least one route.

* * * * *